United States Patent [19]
Kitamura et al.

[11] Patent Number: 5,488,623
[45] Date of Patent: Jan. 30, 1996

[54] MOLD-TYPE SEMICONDUCTOR LASER DEVICE WITH REDUCED LIGHT-EMITTING POINT DISPLACEMENT DURING OPERATION

[75] Inventors: Shoji Kitamura; Yoichi Shindo; Akira Amano, all of Kawasaki, Japan

[73] Assignee: Fuji Electric Co., Ltd., Kanagawa, Japan

[21] Appl. No.: 289,574

[22] Filed: Aug. 12, 1994

Related U.S. Application Data

[60] Division of Ser. No. 43,482, Apr. 6, 1993, Pat. No. 5,444,726, which is a continuation-in-part of Ser. No. 788,601, Nov. 6, 1991, Pat. No. 5,355,385.

[30] Foreign Application Priority Data

| Nov. 7, 1990 | [JP] | Japan | 2-302258 |
| Apr. 1, 1992 | [JP] | Japan | 4-85323 |
| Jan. 22, 1993 | [JP] | Japan | 5-8679 |
| Mar. 30, 1993 | [JP] | Japan | 5-70597 |

[51] Int. Cl.$^6$ ............................................. H01S 3/04
[52] U.S. Cl. ............................... 372/36; 372/49; 372/34
[58] Field of Search .................................. 372/36, 34, 49

[56] References Cited

U.S. PATENT DOCUMENTS

| 4,638,343 | 1/1987 | Althaus et al. | 357/17 |
| 4,712,127 | 12/1987 | Colombo et al. | 357/72 |
| 4,852,112 | 7/1989 | Kagawa et al. | 372/49 |
| 4,951,291 | 8/1990 | Miyauchi et al. | 372/49 |
| 4,951,292 | 8/1990 | Kuindersma et al. | 372/49 |
| 4,962,985 | 10/1990 | LeGrange | 350/96.15 |
| 4,975,922 | 12/1990 | Sakane et al. | 372/49 |
| 4,985,370 | 1/1991 | Ponjee et al. | 437/129 |
| 5,140,384 | 8/1992 | Tanaka | 357/17 |
| 5,307,362 | 4/1994 | Tanaka et al. | 372/50 |
| 5,309,460 | 5/1994 | Fujimaki et al. | 372/36 |

FOREIGN PATENT DOCUMENTS

| 0366472 | 5/1990 | European Pat. Off. . |
| 416195A2 | 3/1991 | European Pat. Off. . |
| 0466975A1 | 1/1992 | European Pat. Off. . |
| 592746A1 | 4/1994 | European Pat. Off. . |
| 2127239 | 10/1972 | France . |
| 4307570A1 | 9/1993 | Germany . |

(List continued on next page.)

OTHER PUBLICATIONS

Patent Abstract of Japan, vol. 17, No. 238 (E–1363) relating to Japanese Patent document 4–364791, published Dec. 17, 1991, Abstract published May 13, 1993.
European Search Report dated Aug. 26, 1993 for EP 93 10 5799.
Patent Abstracts of Japan, vol. 14, No. 507 (E–998) Nov. 6, 1990, abstract, JP 2 209 786, Miyahara Hiroyuki et al., Semiconductor Laser Device.
Patent Abstracts of Japan, vol. 14, No. 507 (E–998) Nov. 6, 1990, abstract, JP 2 209 785, Miyahara Hiroyuki et al., Optical Semiconductor Device.

(List continued on next page.)

*Primary Examiner*—James W. Davie
*Attorney, Agent, or Firm*—Finnegan, Henderson, Farabow, Garrett & Dunner

[57] ABSTRACT

A semiconductor laser device includes a lead frame for electrically controlling a laser diode element having at least one end lace for emitting a laser beam and for mechanically supporting the laser diode element on a planar major surface thereof with a support member interposed therebetween. A sealing resin layer, transparent to the passage of the laser beam, covers at least the laser diode element on the lead frame in a sealing manner. To improve the light emitting point stability of the laser diode element, when the cross section of the planar major surface of the lead frame is parallel to the light emitting end face, a horizontal direction is the longitudinal direction of the cross section of the lead frame, a horizontal center line defines the center of the cross section of the lead frame, and a vertical center line defines the center as viewed in the vertical direction, the sealing resin layer is shaped symmetrically with respect to the vertical center line.

1 Claim, 15 Drawing Sheets

FOREIGN PATENT DOCUMENTS

| | | |
|---|---|---|
| 58-194381 | 11/1983 | Japan . |
| 60-12782 | 1/1985 | Japan . |
| 60-206185 | 10/1985 | Japan . |
| 1-166591 | 6/1989 | Japan . |
| 2-33979 | 2/1990 | Japan . |
| 2-125687 | 5/1990 | Japan . |
| 2-125688 | 5/1990 | Japan . |
| 2-159084 | 6/1990 | Japan . |
| 2-224359 | 9/1990 | Japan . |
| 4-137580 | 5/1992 | Japan . |
| 4-320386 | 11/1992 | Japan . |
| 4-346281 | 12/1992 | Japan . |
| 2005917 | 4/1979 | United Kingdom . |

OTHER PUBLICATIONS

Patent Abstracts of Japan, vol. 13, No. 541 (E–854) Dec. 5, 1989, abstract, JP 1 222 492, Kume Masahiro et al., Semiconductor Laser Device.

Patent Abstracts of Japan, vol. 10, No. 69 (E–389) Mar. 18, 1986, abstract, JP 60 217 687, Sawai Masaaki, Light–Emitting Electronic Device.

Patent Abstracts of Japan, vol. 12, No. 486 (E–695) Dec. 19, 1988, abstract JP 63 200 583, Yano Morichika et al., Semiconductor Laser Device.

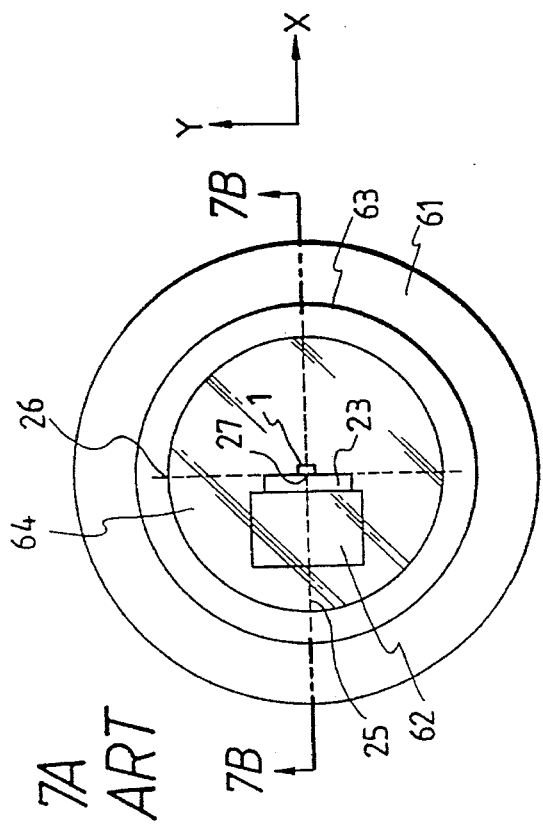
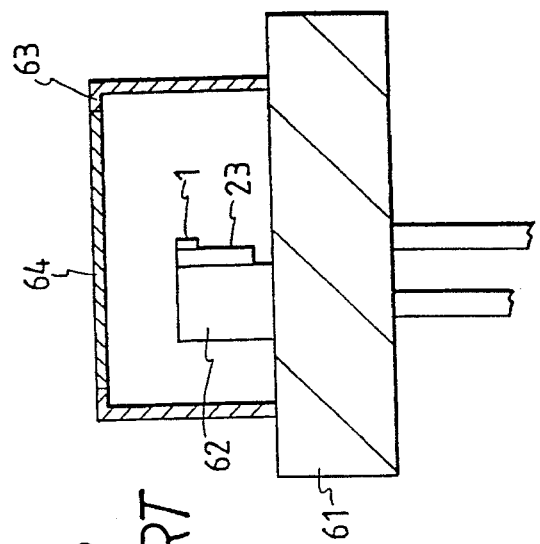
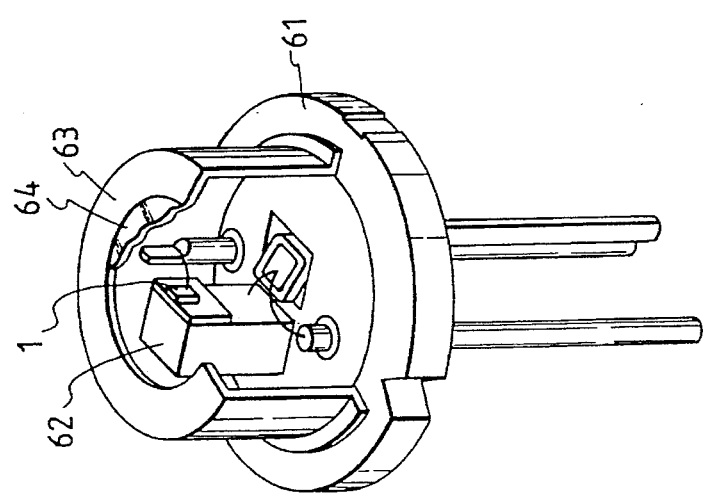
FIG. 7A PRIOR ART
FIG. 7B PRIOR ART
FIG. 6 PRIOR ART

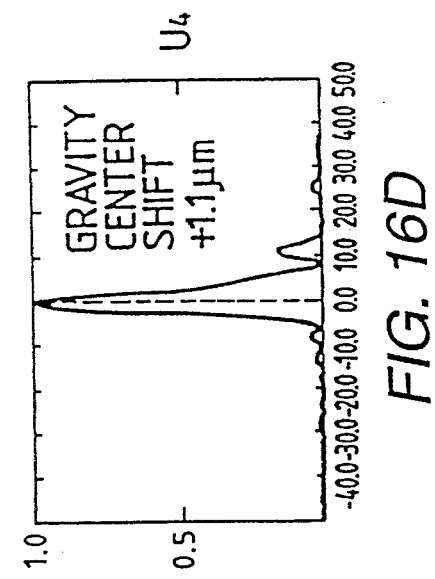
FIG. 16A
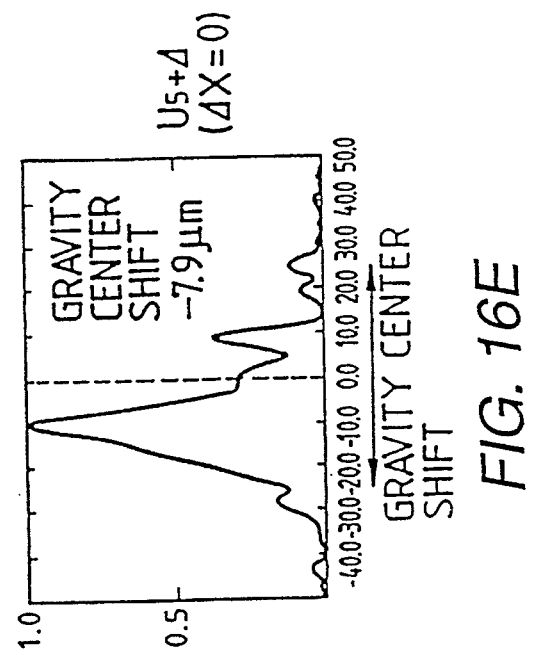
FIG. 16D
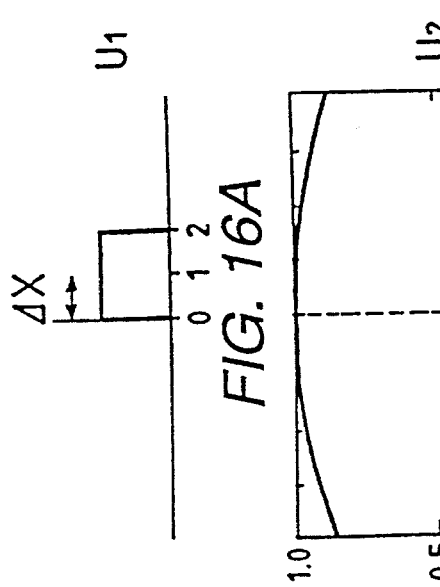
FIG. 16B
FIG. 16C
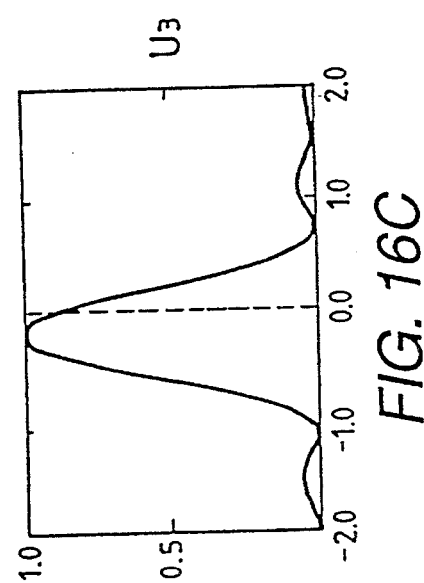
FIG. 16E

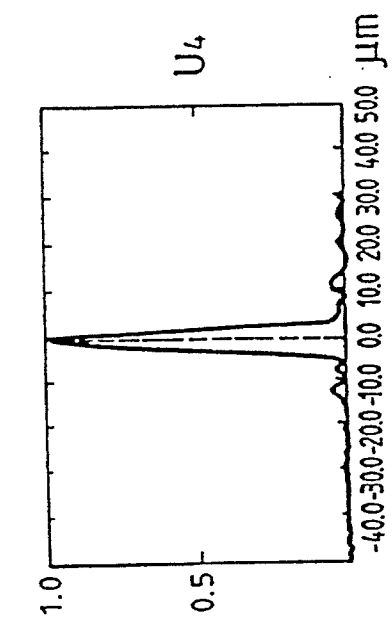
FIG. 16F
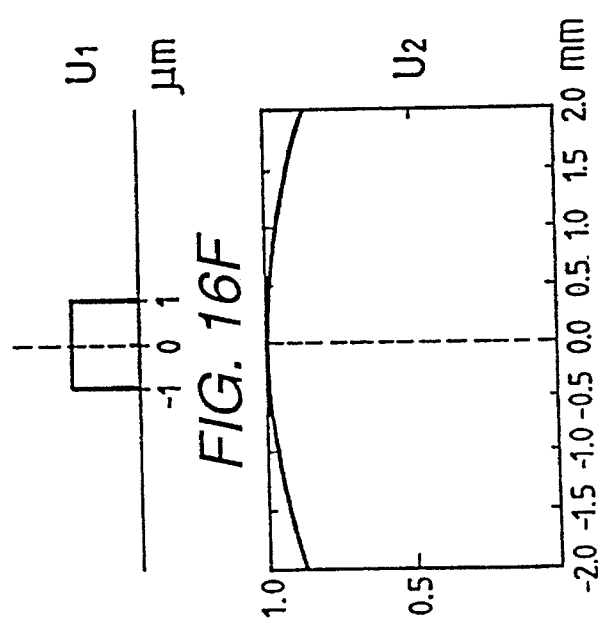
FIG. 16G
FIG. 16H
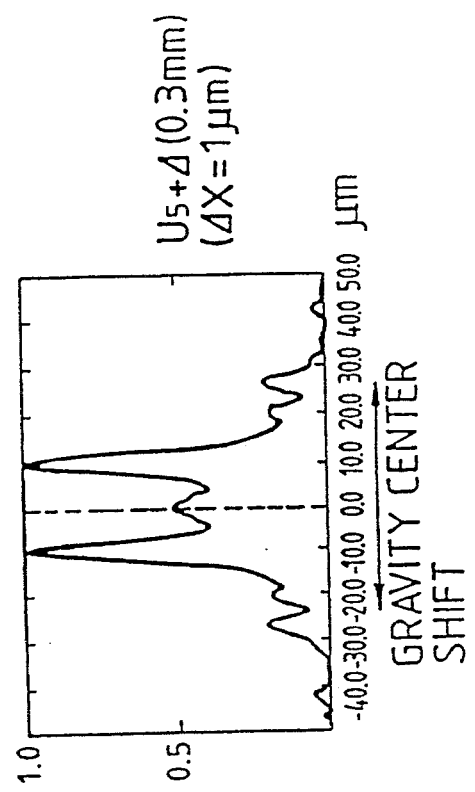
FIG. 16I
FIG. 16J
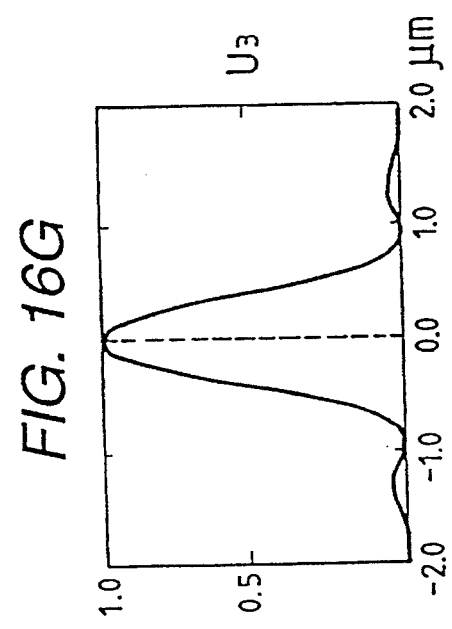

LASER BEAM

MOLD-TYPE SEMICONDUCTOR LASER DEVICE WITH REDUCED LIGHT-EMITTING POINT DISPLACEMENT DURING OPERATION

This is a division of application Ser. No. 08/043,482, filed Apr. 6, 1993 U.S. Pat. No. 5,444,726 which is a continuation-in-part of application Ser. No. 07/788,601, filed Nov. 6, 1991 U.S. Pat. No. 5,355,385.

BACKGROUND OF THE INVENTION

1. Field of the Invention

The present invention relates to semiconductor laser devices of the mold-type in which a laser diode element is encapsulated in a sealing resin layer, and more particularly to a semiconductor laser device that experiences minimal displacement of its light emitting point during continuously operation and/or during changing ambient conditions.

2. Discussion of the Prior Art

A semiconductor laser device of the can-type as shown in FIGS. 6, and 7A and 7B is known in the art. As shown in FIG. 6, a laser diode element 1 is soldered to a radiator 62 supported on a stem 61. A cap 63 with a glass window 64 is soldered to the stem 61. In the semiconductor laser device shown in FIGS. 7A and 7B, a laser diode element 1 is mounted to a submount provided by a photo diode 23, which is then mounted on a radiator 62 extending upwardly from the stem 61. The photo diode 23 submount also serves as a radiator plate. The laser diode element 1 is covered with a cap 63 also fastened to the stem 61. The combination of the radiator 62 and the photo diode 23 are positioned so that the laser diode element 1 As located at the center of the glass window 54 An cap 53, as viewed from the front; the center being designated by an intersection point 27 of a horizontal center line 25 (at a right angle to the major surface of the radiator 62, or an X-axis direction) and a vertical center line 26 (parallel to the major surface of the radiator 62, or a Y-axis direction).

Another semiconductor laser device of a resin sealing mold-type has been developed. This type of laser device is less expensive and can be shaped more flexibly than the can-type laser device disclosed above. The mold-type laser device is described in detail in Published Unexamined Japanese Patent Application No. Hei. 2-125687. In this device, as shown in FIG. 8 herein, a laser diode element 1 is mounted on a submount 23 and then sealed in a sealing resin layer 11 comprised of transparent epoxy resin, for example. The element 1 is electrically powered through lead frames 20 and a gold wire 21. The semiconductor laser device of the mold-type has been known as a light emitting device of low light density per unit area, analogous to an LED.

The laser device of the mold-type is advantageous because of low manufacturing cost and the resin sealing layer can be of a wide variety of shapes. Additionally, the laser diode element can be used in high light density applications without any characteristic deterioration owing to light damage if an end face destruction preventing layer is used. A semiconductor laser device incorporating an end-face destruction preventing layer is described in detail in commonly assigned U.S. Application Ser. No. 07/788, 601, filed Nov. 6, 1991, U.S. Pat. No. 5,355,385.

One example of the laser device disclosed in patent application Ser. No. 07/788,601 will be described with reference to FIGS. 9 through 12. The laser diode element 1 is illustrated as having a DH (double heterodyne Junction) structure. As shown, an n-type clad layer 3 made of AlGaAs, an active layer 4, a p-type clad layer 5, and a p-type cap layer 6 made of GaAs are layered on an n-type GaAs substrate 2. An electrode 7 is selectively formed on the obverse side of the laser diode element in an opened portion of the p-type cap layer 6. An electrode 8 is formed on the rear side of the substrate 2. End-face destruction preventing layers 10 (FIG. 10) are respectively formed on the light emitting end faces of the laser diode element and are irradiated with laser beams. The end-face destruction preventing layers 10 are made of organic resin, which exhibits high heat resistance and low absorption coefficient in the wavelength region of the emitted laser beams.

As best illustrated in FIG. 11, the laser diode element 1 is mounted on a photo diode 23 serving also as a submount layer and a radiator plate. The photo diode 23 is mounted on the top end portion of the center lead frame of laterally arrayed lead frames 20. The photodiode 23 and the p-type cap layer 6 are connected to the respective lead frames 20 by bonding wires, for example, gold wires (not shown). The laser diode element 1, connected to those lead frames 20, is enclosed by resin 11, such as transparent epoxy resin, in a sealing manner. The semiconductor laser device of the mold-type, which includes the laser diode element 1 having the end-face destruction preventing layers 10, is low in cost and good in endurance.

In the semiconductor laser device of the mold-type, as shown in FIGS. 12A and 12B, the laser diode element 1 is positioned at or near the center the sealing resin layer 11, which is designated by intersection point 27 of the X axis 25 and the Y axis 26, as in the semiconductor laser device of the can-type. The center 28 of the lead frame 20 is displaced by distance $\Delta X_{off}$ (or offset 29), from the intersection point 27 of the sealing resin layer 11, because of the total thickness of the laser diode element 1, the photo diode 23 and the lead frame 20.

Those semiconductor laser devices are assembled into various types of optical systems. A typical example of the optical system is a pick-up device for an optical disc as schematically illustrated in FIG. 13A.

In the pick-up device illustrated, a laser beam emitted from the laser diode element 1 passes through a diffraction grating 51, turned 90° by a half mirror 52, and focused on the surface of a disc 54 through an objective lens 53. The laser beam is separated into a main beam and a subbeam by the diffraction grating 51. The subbeam is used for tracking servo purposes. The laser beam, reflected by the disc, 54 passes through the objective lens 53 and the half mirror 52 again and is projected onto the light sensor 55. The sensor transforms the received laser beam into a corresponding electrical signal.

The light sensor 55 consists of six photo diodes A to F, as shown in FIG. 13B. The main beam is incident on the quartered diodes A to D. The laser beam experiences astigmatism as it passes through the half mirror 52, and the shape of the main beam changes as indicated by the dotted lines in FIG. 13B, depending on the location of the photo diodes.

The focusing servo mechanism positions the objective lens 53 so that $(A+C)-(B+D)-0$ where A, B, C and D are outputs of the photo diodes A, B, C and D. The "gravity center of beam on the photo diodes", to be discussed later, is defined as $$[X, Y]=[\{(A+B)-(C+D)\}/(A+B+C+D), \{(A+D)-(B+C)\}/(A+B+C+D)]$$

In the semiconductor laser device of the mold-type, it has been discovered that the light emitting point, i.e., the origin of the emitted laser beam, shifts location when the laser device is continuously operated and/or ambient conditions change. Shifting or displacement of the light emitting point is graphically represented in FIG. 14. To plot the graph of the figure, a mold-type semiconductor laser device was operated at room temperature while being fed with an operating current of 50 mA. In the graph, the abscissa represents time in minutes, and the ordinates represents the extent of displacement in the X-axis direction (normal to the lead frame surface. As seen from the graph, after about two minutes of laser emission, the light emitting point was displaced 0.5 μm in the −X-axis direction (i.e., toward the lead frame 20). After the device was turned off for about two minutes, the light emitting point returned to the original center point (moved in the +X-axis direction, or toward the laser diode). When the semiconductor laser device is assembled into a pick-up device, the extent of displacement of the gravity center of the beam on the photo diodes depends on the duration of continuous laser device operation and/or changes in ambient temperature.

The semiconductor laser device was operated at an output power of 3 mW at ambient temperatures from −10° C. to 60° C. The gravity center of beam on the photo diodes was found to be displaced 10 μm or more. Minimization of the displacement of the light emitting point is essential in order that the semiconductor laser devices of the mold-type, which has many advantages, acquire the excellent performance achieved by can-type semiconductor laser devices.

Turning to FIG. 15, there is shown a simulation model of the influence of light emitting point displacement when the laser device operates in a pick-up device. In the simulation, a one-dimensional optical system was utilized, in which a laser beam from a laser diode LD1, located on the left side, passes through a convex lens 79, separated from the diode LD1 by a distance d1, and the laser beam, reflected by a disc 73, then passes through another convex lens 80 to be focused on a photo diode (PD) 69. The one-dimensional system was treated as a double Fourier transform optical system. A light intensity distribution U2 on the convex lens 79, a light intensity distribution U3 on the disc 73, a complex amplitude U4 on the convex lens 80, and a light intensity distribution U5+Δ were calculated using Fresnel's diffraction formula, with the assumption that the light intensity distribution U1 on the laser diode element 1 is rectangular in shape, is centered at ΔX and has a width of 2 μm. The ΔX corresponds to the extent of displacement of the light emitting point of the laser diode. The results of the calculations using the parameters in Table 1 are shown in FIGS. 16A–16J.

FIGS. 16F–16J are graphical representations of the light distributions U1, U2, U3, U4 and U5+ΔX=0, and FIGS. 16A–16E is a graphical representations of the same when ΔX=1 μm. A beam spot gravity center on the photo diode can be calculated using the light intensity distribution (U5+Δ) on the photo diode. When the displacement quantity ΔX of the light emitting point was 1 μm, a shift of the beam spot gravity point, when calculated, was 7.9 μm. Similar calculations were repeated for other quantities of the displacement. The results of the calculation showed the relationship between the quantity of displacement of the light emitting point and the quantity of shift of the beam spot gravity center on the photo diode, as shown in FIG. 17. Thus, in an pick-up optical system, 1 μm displacement of the light emitting point produces a 7.9 times larger shift in the beam spot gravity center on the surface of the photo diode. This value is defined as a coupling magnification M between the laser diode element and the photo diode. The coupling magnification M is determined by the magnification of the lens system and the distance of the optical path between the light emitting point of the laser diode element 1 and the signal detection, divided photo diode. Accordingly, the coupling magnification M differs with the construction of the optical pick-up device.

TABLE 1

| Δx | 1.0 μm |
|---|---|
| d1 | 25.0 μm |
| f | 3.9 μm |
| d2 | 4.6 μm |
| lens diameter | 4.0 μm |
| Δ | 0.3 μm |

Note:
For the symbols in the table, refer to FIG. 15.?

In the conventional semiconductor laser device, the extent of the shift of the beam spot on the photo diode 69 can exceed a tolerable value. Accordingly, a mechanism to adjust the displacement of the light emitting point or a mechanism to follow the shift of the beam spot gravity center is required for the conventional semiconductor laser device.

Thus, the semiconductor laser device of the mold-type is advantageous in that it is inexpensive and can be flexibly shaped. However, when it is utilized in an application requiring good light emitting point stability, an additional adjusting mechanism is required. This negates the advantages of laser devices of the mold-type.

SUMMARY OF THE INVENTION

The present invention has been made in view of the above circumstances and has an object to provide a semiconductor laser device of the mold-type which has less displacement of the light emitting point, and hence is directly applicable for devices requiring good stability of the light emitting point, such as a pick-up device in an optical system for a compact disk.

To solve the problems of conventional semiconductor laser devices the inventors carefully studied the relationship between the lead frame supporting the laser diode element and the sealing resin layer for sealing the lead frame and the laser diode element and have succeeded in minimizing the shift of the lead frame, which is caused by the sealing resin layer.

According to the present invention, a semiconductor laser device, having a lead frame for electrically controlling a laser diode element having at least an end face for emitting a laser beam and for mechanically supporting the laser diode element on the planar major surface thereof with a support member interposed therebetween, and a sealing resin layer allowing the laser beam to pass therethrough and covering at least the laser diode element on the lead frame in a sealing manner, is improved in that the sealing resin layer is shaped symmetrically with respect to the lead frame. When the cross section of the lead frame is parallel to the light emitting end face, the laser diode element is supported at the center of the lead frame when viewed in the horizontal direction, and the sealing resin layer is shaped symmetrically with respect to the vertical center line. While the resin layer portion sealing the lead frame and laser diode is, in accordance with the invention, substantially symmetrical, the external form of the remaining portion of the resin layer may be tubular, rectangular or trapezoidal.

In the semiconductor laser device having the sealing resin layer, lead frame fixing means are employed to affix the lead frame to an external fixing board, with the laser diode element mounted on a planar major surface of the lead frame by way of an interposed support member.

For the fixing means, the surface of the lead frame opposite to the surface to which the laser diode element is mounted, may be used as a mounting surface to be placed, for mounting, against an external fixing board.

In the semiconductor laser device in which the end face of the lead frame lies in a plane containing the light emitting end face, a horizontal direction is defined for the center of the horizontal center line, and a vertical direction is defined for the center of the vertical center line, the planar mounting surface of the sealing resin layer is uniformly separated from the surface of the lead frame parallel to the horizontal center line or the vertical center line by a distance $\Delta X1$ that is defined by the following formula $$\Delta X1 \leq (\Delta L/M)/(\alpha \times \Delta T), \text{ where} \qquad (1)$$

$\alpha$ is the linear expansion temperature coefficient of the sealing resin layer;

$\Delta T$ is the change in ambient temperature;

$\Delta L$ is the tolerable shift of the beam spot on the divided photo diode of a pick-up device and a semiconductor laser device is used as a reproduction light source in an optical disc system; and M is the image forming magnification of a lens system including at least one lens, which is located along the distance of an optical path between a light emitting point of a laser diode element and the divided photo diode of a pick-up device.

There are many causes producing displacement of the light emitting point of a laser diode element. The inventors of the present patent application paid particular attention to the thermal expansion of the sealing resin layer, which results from the heat generated when the laser diode element operates. In the present invention, the displacement of the lead frame, which is most sensitive to thermal expansion of the sealing resin layer, is minimized in order to obtain less displacement of the light emitting point.

Also in the present invention, the sealing resin layer is shaped symmetrically with respect to the lead frame. Consequently, forces exerted on the lead frame resulting from horizontal and vertical thermal expansion of the sealing resin layer can be distributed uniformly. As a result, distortion of the lead frame owing to differences in thermal expansion is considerably reduced. Hence, less displacement of the light omitting point is obtained.

Fixing the lead frame to an external fixing board can remove the influence of thermal expansion of the sealing resin layer and minimize light emitting point displacement. The lead frame fixing means may include an uncovered surface of the lead frame, which provides a mounting surface for placement against the external fixing board. When the mounting surface is the uncovered surface of the lead frame, the heat generated when the laser diode element operates can be effectively transferred from the resin sealing layer through the lead frame to the external fixing board. Therefore, thermal expansion of the sealing resin layer is reduced to minimize the influence of thermal expansion on the lead frame.

The fixing means may include at least one through-hole formed in the uncovered lead frame. In this case, fasteners of low thermal expansion are inserted into the through-hole to affix the lead frame to an external fixing board.

To gain less displacement of the light emitting point, the thickness of the sealing resin layer, that is, the separation or distance of the resin layer form the external fixing board, may be selected so that displacement of the lead frame falls within a tolerable range.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIG. 6 is a perspective view, partially broken away, of a conventional semiconductor laser device of the can-type;

FIG. 7A is a front view of the semiconductor laser device shown in FIG. 6;

FIG. 7B is a cross sectional view taken along line 7B—7B in FIG. 7A;

FIGS. 16F–16J are graphical representations of simulated pick-up device light distributions U1, U2, U3, U4 and U5+Δ when ΔX=0;

FIGS. 16A–16E are graphical representations of simulated pick-up device light distributions as in FIG. 16A when ΔX=1 μm;

FIGS. 19A to 19E are cross sectional views showing specific examples of fixing means used for a semiconductor laser device;

DETAILED DESCRIPTION OF THE PREFERRED EMBODIMENTS

Figure 1A:
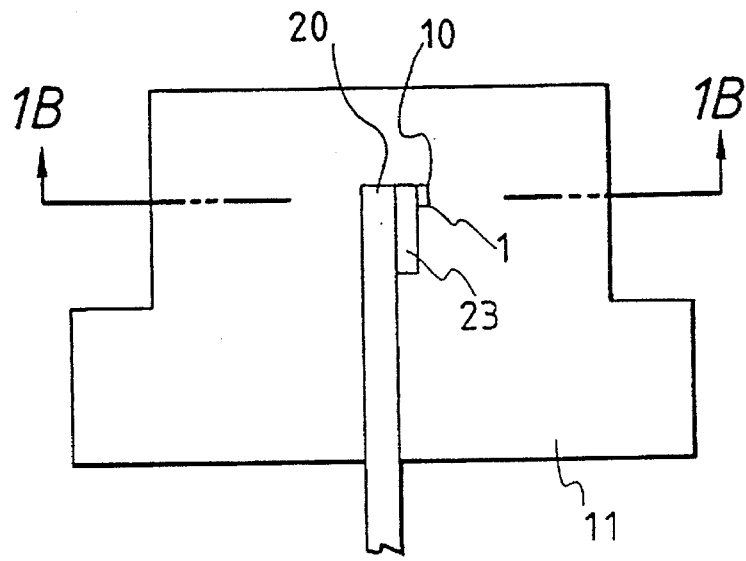
FIG. 1A is a cross sectional view of a semiconductor laser device according to a first embodiment of the present invention, which is taken along, line 1A—1A in FIG. 1B.
Figure 1B:
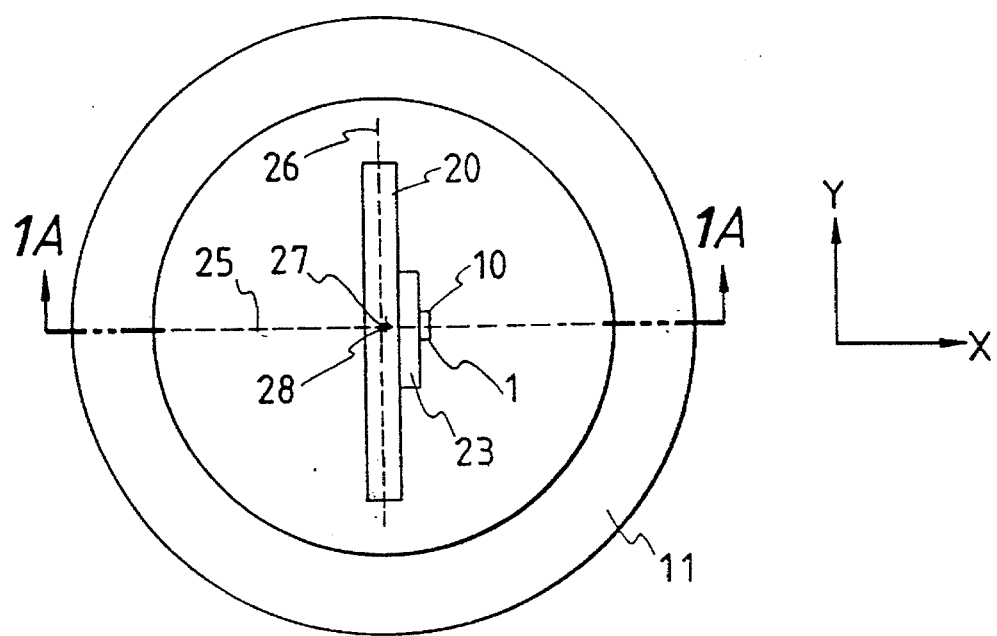
FIG. 1B is a cross sectional view taken along line 1B—1B of FIG. 1A.
Figure 12A:
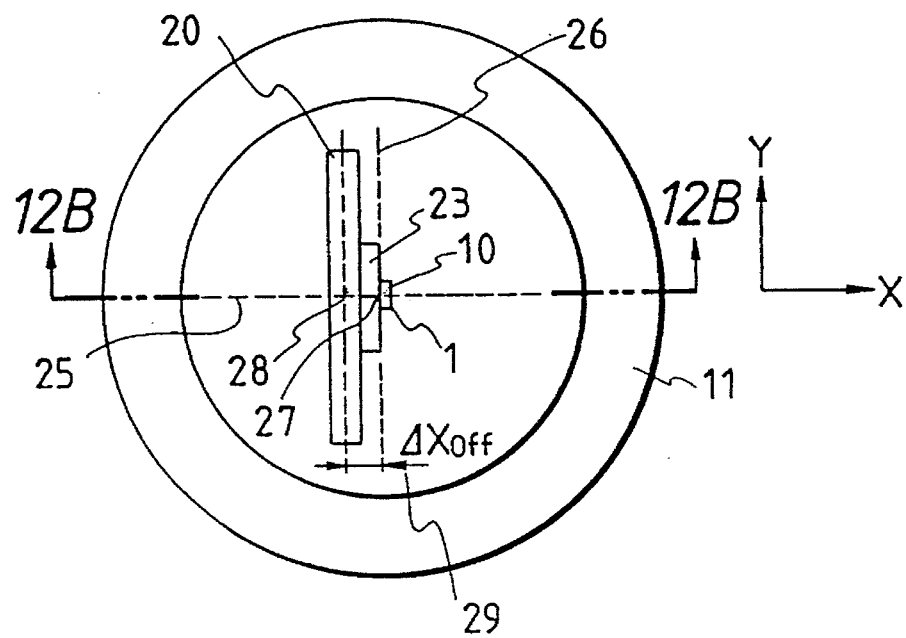
FIG. 12A is a plan view of the semiconductor laser device shown in FIG. 8.
Figure 12B:
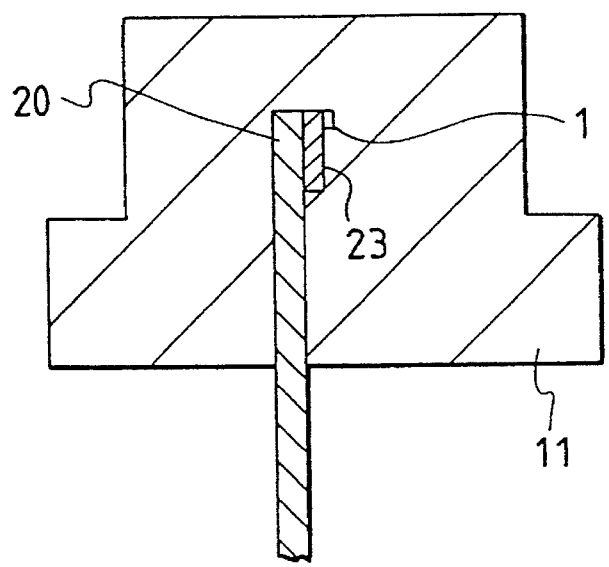
FIG. 12B is a cross sectional view taken along line 12B-12B of FIG. 12A.
Figure 13A:
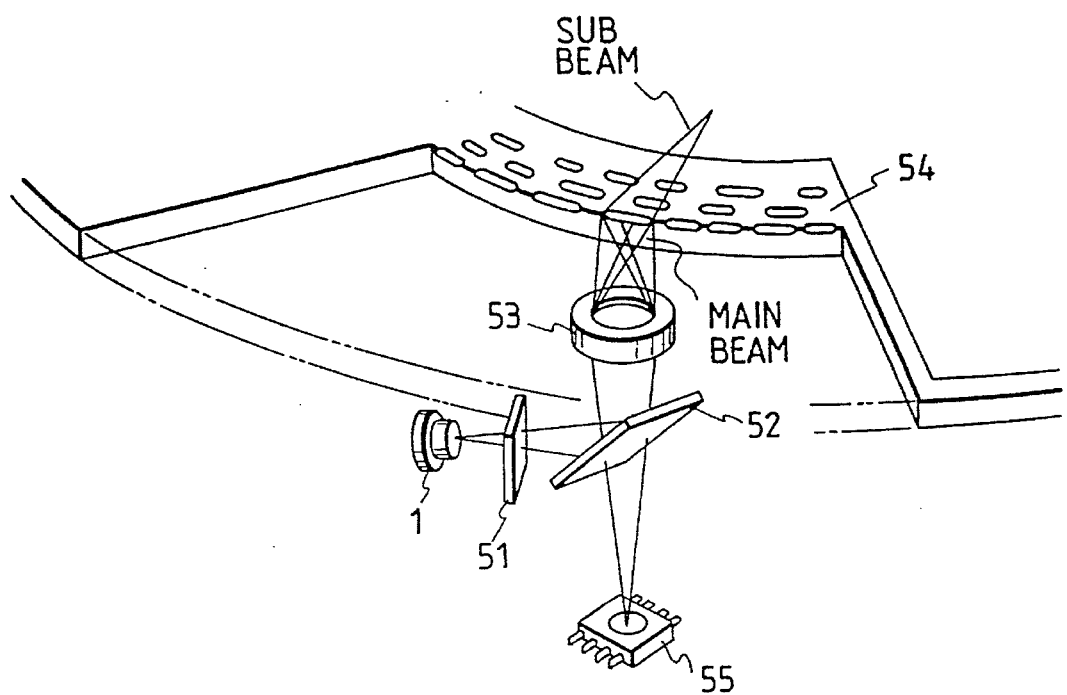
FIG. 13A is a perspective view showing an optical system of a pick-up device for an optical disc, which uses a semiconductor laser device.
Figure 13B:
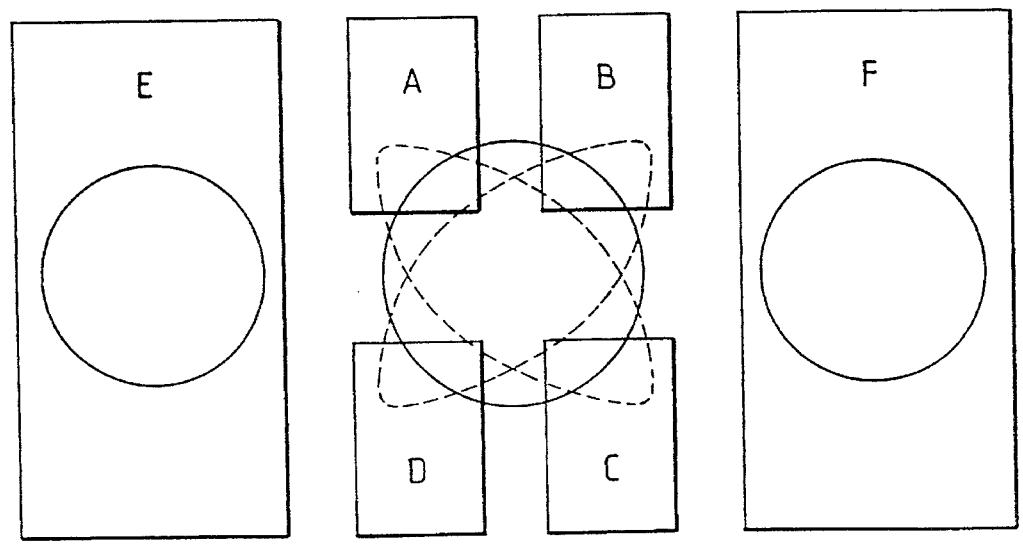
FIG. 13B is an explanatory diagram showing the construction of a light sensor contained in the optical system of FIG. 13A.
Figure 14:
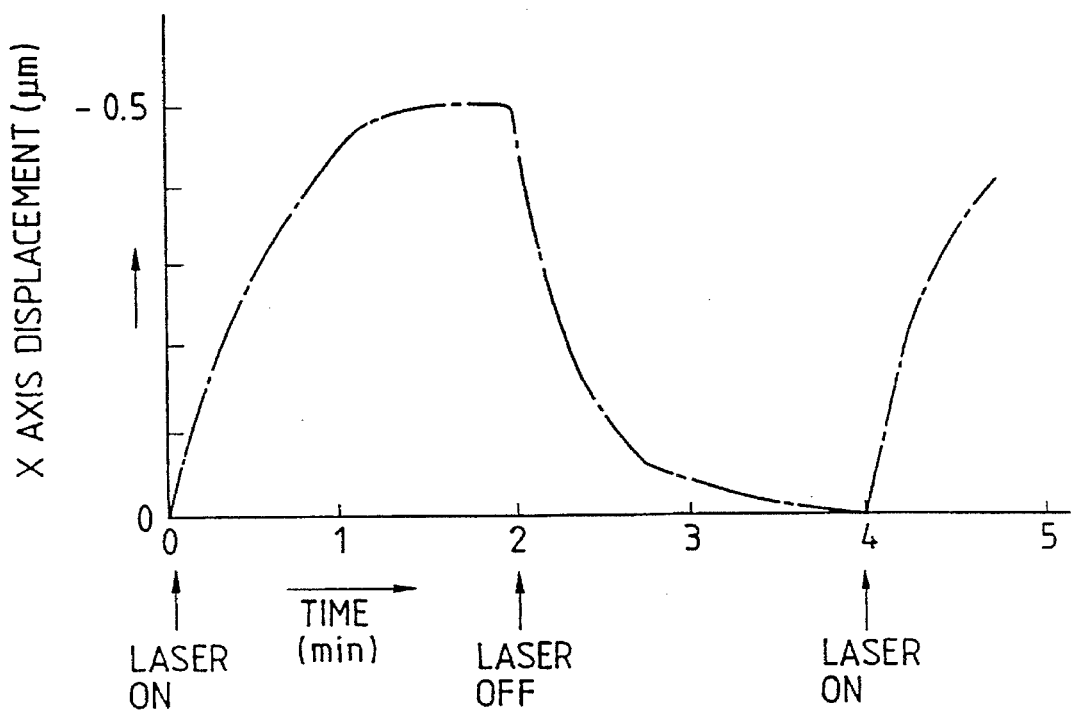
FIG. 14 is a graph showing displacement of the light emitting point of a semiconductor laser device in the X direction versus device operating time.
Figure 15:
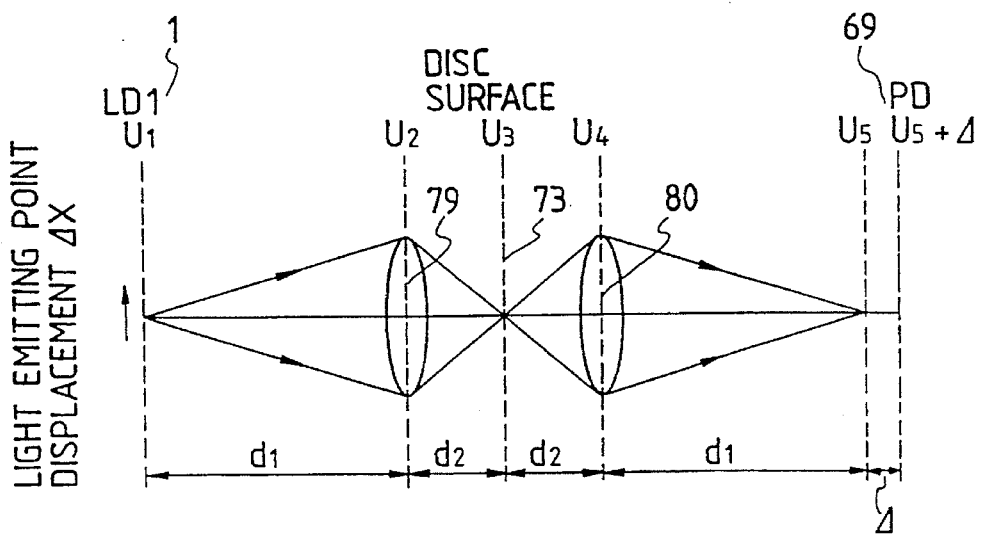
FIG. 15 is a diagram of a one-dimensional simulation for examining displacement of the light emitting point in a pick-up device for a compact disc.
Figure 17:
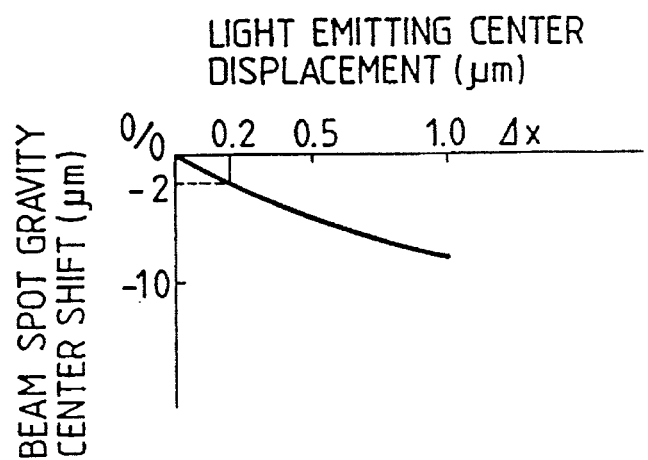
FIG. 17 is a graph showing the relationship between shifts of the gravity center of a beam spot and displacements of the light emitting point, which result from the simulations of FIGS. 16A and 16B.

FIGS. 1A and 1B cooperate to show the construction of a semiconductor laser device according to a first embodiment of the present invention, which is of the mold-type already generally described with reference to FIG. 12.

Figure 10:
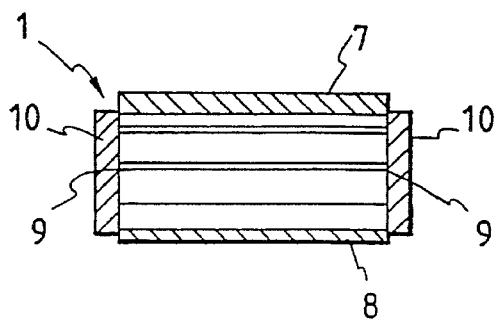
FIG. 10 is a cross sectional view taken along line 10—10 of FIG. 9.
Figure 11:
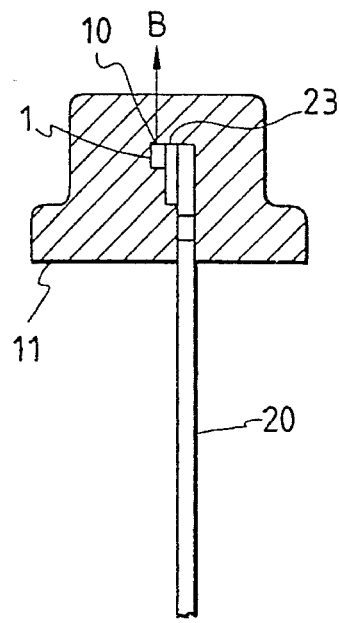
FIG. 11 is a cross sectional view of a semiconductor laser device of the mold-type.
Figure 9:
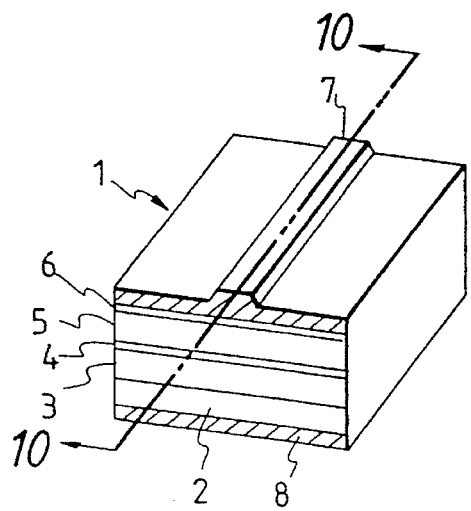
FIG. 9 is a perspective view showing the structure of a laser diode element used in the semiconductor laser device of FIG. 8.

As shown, a laser diode element 1, which has end-face destruction preventing layers 10, as best seen in FIG. 10, is secured to a lead frame 20, with a photo diode 23 interposed therebetween. The lead frame 20 mechanically supports and electrically controls the laser diode element I and the photo diode 23. The photo diode 23 also serves as a submount and a radiator plate for laser diode element 1. The assembly of the laser diode element 1, the photo diode 23, and the lead frame 20 is encapsulated with a sealing resin layer 11 made of transparent epoxy resin. Like or equivalent portions of the laser device of FIG. 1 wall be designated by like reference numerals used in the drawings illustrating the conventional laser devices and other embodiments of the invention.

It is to be noted that an intersection point 27 of a center line 25 of the sealing resin layer 11, which extends in the horizontal direction (perpendicular to the lead frame major planar surface, and referred to as an X-axis direction) and a center line 26 in the vertical direction (parallel to the plane of the lead frame major planar surface, and referred to as a Y-axis direction) is coincident with a center 28 of the lead frame 20. However, as noted earlier, the center 27 of the sealing resin layer 11 is displaced from the center 28 of the lead frame 20 by an offset 29 (FIG. 12A). Specifically, in the cross section of FIG. 1B, which is parallel to the light-emitting end face of the laser diode element 1 on which the end-face destruction preventing layer 10 is formed, the Y axis 26 defining the vertical direction and the X axis 25 defining the horizontal direction, respectively, are coincident with the horizontal and vertical center lines of the sealing resin layer. Thus, the sealing resin layer 11 is formed symmetrically with respect to the X axis 25 and the Y axis 26. Therefore, the thickness of the sealing resin layer 1I around the lead frame 20 is uniform, i.e., the resin sealing layer is symmetrical above the lead frame. Consequently, the distribution of thermal stresses or forces on the lead frame 20, which are caused by heat generated by the laser beam emission, are balanced and generally cancelled out. Accordingly, displacement of the lead frame 20 may be limited by the shapes of the lead frame 20, the photo diode 23 and the laser diode element 1. Therefore, displacement of the lead frames 20 can be markedly reduced as compared to conventional devices. Hence, displacement of the light emitting point of the laser diode element 1 mounted by the lead frame 20 can be minimized. To make the center 28 of the lead frame 20 coincident with the center 27 of the sealing resin layer 11, the laser diode element 1 must be displaced from the center 27 of the sealing resin layer 11. The optical nature of the sealing resin layer 11 is uniform throughout, and thus laser performance remains unchanged. As described above, the displacement of the light emitting point is caused by differences in the thermal expansion coefficients of the resin and the lead frame when these members are heated by the heat generated by operation of the laser element. The term "symmetrical sealing resin layer", used herein, involves the resin layer having such a shape as to affect the lead frames, but it is not intended to limit an external form of the resin that can be considered to have little or no affect on the lead frame.

Figure 2:
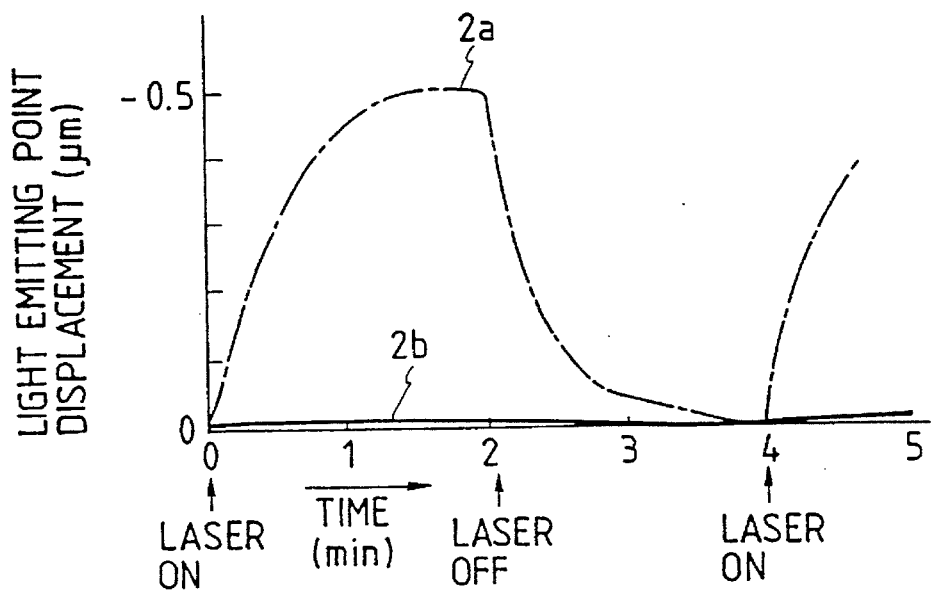
FIG. 2 is a graph comparatively showing variations of the extent of displacement of a light emitting point versus operating time in a conventional laser device and the laser device of FIG.

Turning now to FIG. 2, there is shown a graph comparatively showing variations of displacement of the light emitting point in a conventional laser device and the laser device of FIG. 1 with respect to operating time. In the measurement, the semiconductor laser devices were operated at room temperature with an operating current of 50 mA.

As seen from FIG. 2, in the conventional semiconductor laser device, after the laser device is turned on for about two minutes the light emitting point shifted 0.5 μm in the X direction, i.e., toward the lead frame 20 (curve 2a). on the other hand, in the semiconductor laser device of the invention, the light emitting point shifts minimally, i.e., less than 0.05 μm (curve 2b). This demonstrates that coincidence of the center 28 of the lead frame 20 with the center 27 of the sealing resin layer 11 minimizes shifting of the light emitting point. When the laser device of the present embodiment is utilized in an optical pick-up device, a shift of the beam spot on the photo diode is minimized, as shown in FIGS. 16F–16J.

Thus, the use of the sealing resin layer 11 shaped to be symmetrical with respect to the center lines 25 and 26 of the lead frame 20 succeeds in removing the affects of thermal expansion on the lead frame 20, and hence displacement of the light emitting point is minimized.

The first embodiment has been described using the tubular-shaped semiconductor laser device of the mold-type. It is evident that the present invention is also applicable to flat-shaped semiconductor laser device of the mold-type as shown in FIG. 3, if the sealing resin layer 11 is shaped substantially symmetrical with respect to the center lines within the region near the lead frame 20, which experiences the largest temperature increase.

Figure 3:
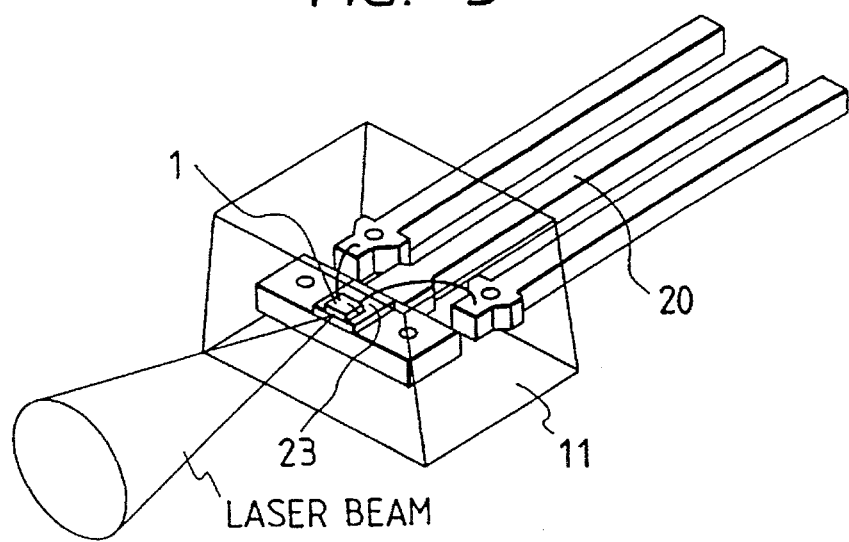
FIG. 3 is a perspective view of a rectangularly shaped semiconductor laser device, which is manufactured using the same technique as for the laser device of FIG. 1A.

The flat-shaped semiconductor laser device shown An FIG. 3 has the same construction as the above-mentioned semiconductor laser device, except for the shape of the sealing resin layer 11. Accordingly, no further description of the laser device will be given.

In the first embodiment described above, the shape of the lead frame is rectangular in cross section. If required, it may have other cross sectional shapes. Particularly in the case where the vertical and horizontal center lines cannot be strictly defined, those center lines may be those center lines that are substantially parallel to the major surfaces of the lead frame.

Figure 4A:
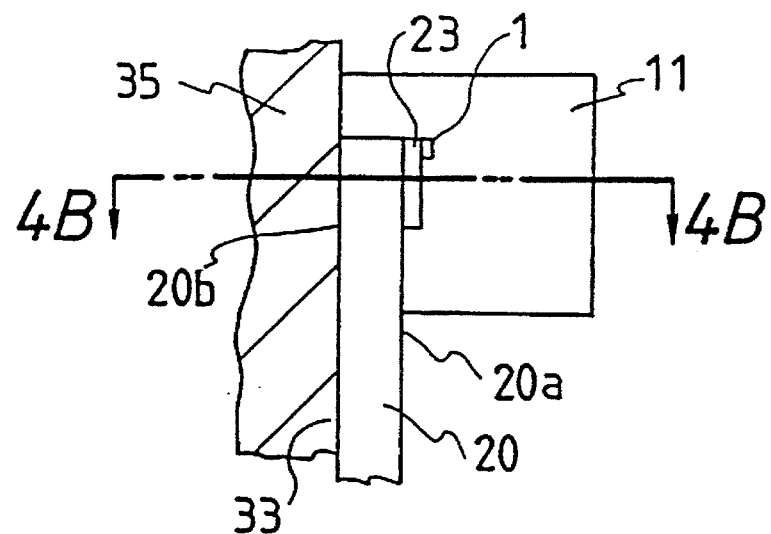
FIG. 4A is a side view, partially in cross section, of a semiconductor laser device according to a second embodiment of the present invention.
Figure 4B:
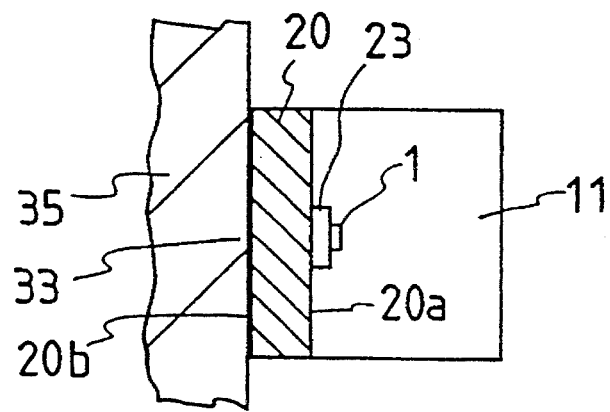
FIG. 4B is a cross section view taken along line 4B—4B of FIG. 4A.

A semiconductor laser device according to a second embodiment of the present invention will be described with reference to FIGS. 4A and 4B. The semiconductor laser device of the second embodiment, like the first embodiment, is also of the mold-type.

As shown, a laser diode element 1 having end-face destruction preventing layers is mounted to a photo diode 23, which, in turn, is mounted to the major planar surface of a lead frame 20. The lead frame 20 mechanically supports and electrically controls the laser diode element 1 and the photo diode 23. The photo diode 23 also serves as a submount and a radiator plate.

In the second embodiment, the laser diode element 1 and photo diode 23 are mounted on surface 20*a* of the lead frame 20. The surface 20*b* of the lead frame 20, opposed to surface 20*a*, is exposed. Specifically, the sealing resin layer 11 extends over the surface 20*a* of the lead frame 20, the laser diode element 1 and the photo diode 23. The surface 20*b* is not covered with the sealing resin layer 11. Accordingly, the semiconductor laser device may be affixed to a fixing board 35 with surface 20*b* of the lead frame bonded to the fixing board 35 by an adhesive 33. Alternatively, through-holes in the lead frame 20 may be used for this fixing purpose, as in the third embodiment to be described in conjunction with FIGS. 20 and 21. Since the laser device, thus constructed, is immovable relative to the fixing board 35, no displacement of the laser device with respect to the fixing board takes place. While the sealing resin layer 11 is placed over only surface 20*a* of the lead frame 20, the thermal expansion of the sealing resin layer 11 has little influence on the lead frame 20. since the lead frame 20 can not move when the temperature of the sealing resin layer 11 rises during operation of the laser device. This contributes to a reduction in displacement of the light emitting point. The effects of the second embodiment were measured under the same conditions as those in the first embodiment, and the results were as shown in FIG. 2.

Figure 18A:
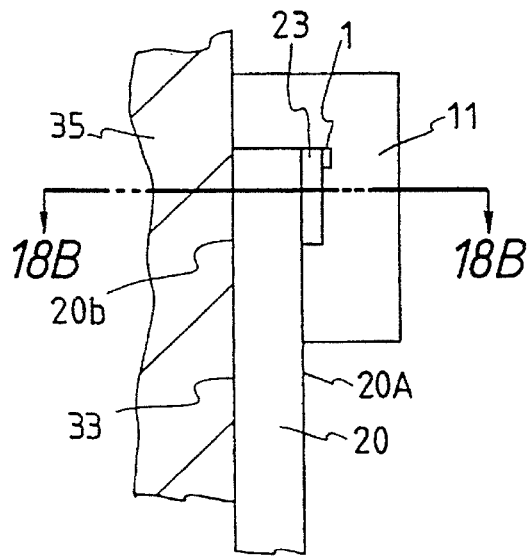
FIG. 18A is a side view showing a semiconductor laser device according to a second embodiment of the invention, in which a sealing resin layer covers only a laser diode element and a phot diode.
Figure 18B:
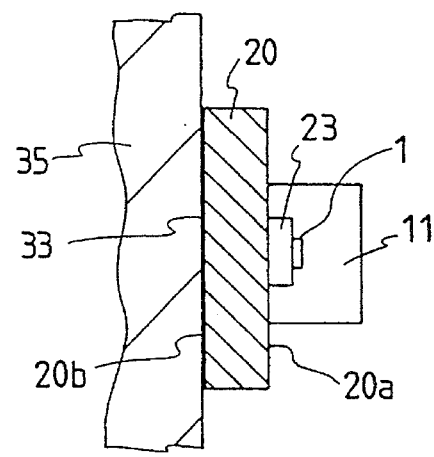
FIG. 18B is a cross sectional view taken along line 18B—18B of FIG. 18A.
Figure 22:
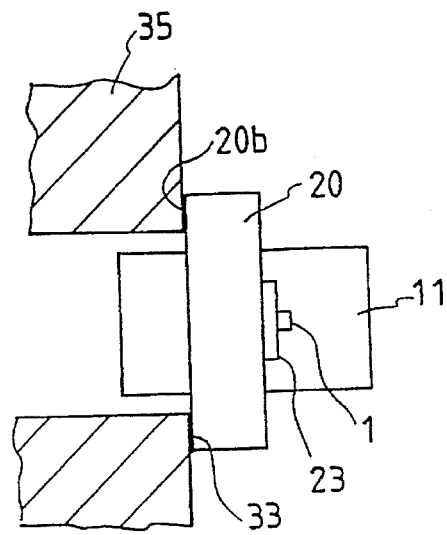
FIG. 22 is a view showing a semiconductor laser device according to a second embodiment of the invention where the lead frame is not covered by the sealing resin layer.
Figure 23:
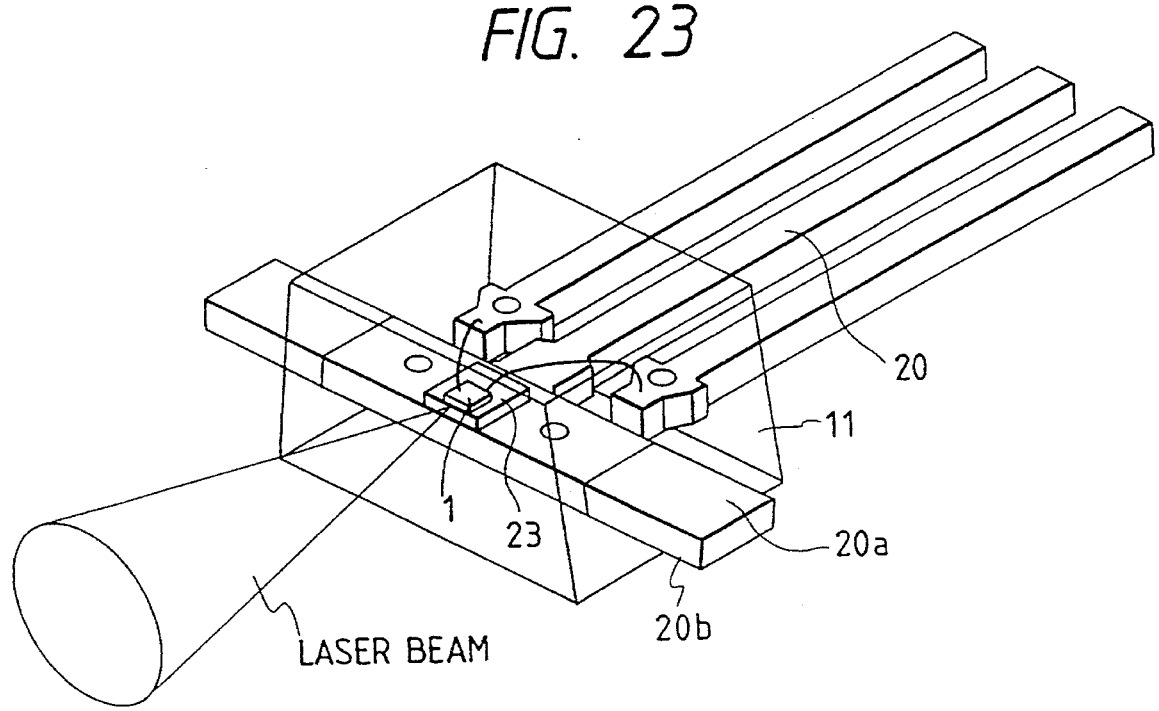
FIG. 23 is a perspective view showing the semiconductor laser device according to the second embodiment where the lead frame is not covered by the sealing resin layer.

While a semiconductor laser device of the mold-type having a rectangular sealing resin layer 11 has been described, the semiconductor laser device may be variously modified if the uncovered surface 20*b* of the lead frame is fixed in place. For example, a semicircular sealing resin layer may be used for the sealing resin layer 11. In modifications of the laser device illustrated in FIGS. 18 and 22, the sealing resin layer 11 covered only the laser diode element 1 and the photo diode 23, and the neighboring region. The laser device of FIG. 22 is bonded to a fixing board 35 by adhesive at a surface of the lead frame not covered with the sealing resin layer. A practical embodiment of the laser device of FIG. 22 is illustrated in perspective in FIG. 23.

A possible way of affixing the laser device to the fixing board is to bond an exposed surface of the lead frame to the fixing board. Additional examples of ways to fix the laser device to the fixing board will be described with reference to FIGS. 19A to FIG. 19E.

Figure 19A:
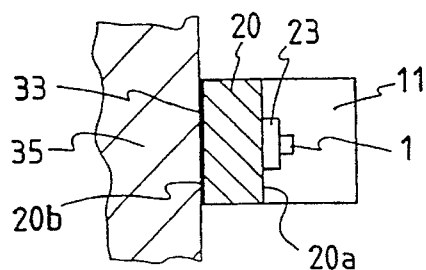

In FIG. 19A, the sealing resin layer 11 covering the laser diode element 1 and the photo diode 23, which are mounted on the lead frame 20, has a width equal to that of the lead frame 20. The uncovered surface 20*b* of the lead frame 20 is bonded to the fixing board 35 by adhesive 33.

Figure 19B:
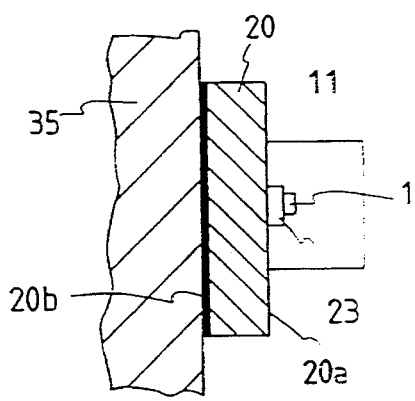

To increase the bonding surface, the width of the lead frame 20 is made larger than the width of the sealing resin layer 11, as shown in FIG. 19B.

Figure 19C:
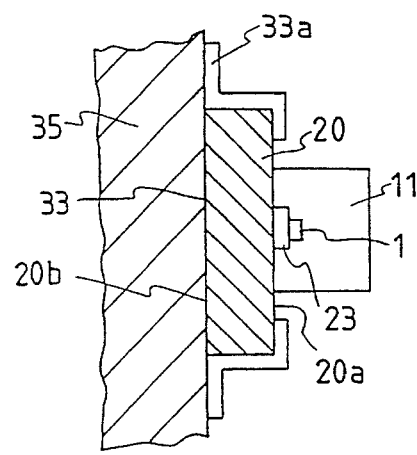
Figure 19C:
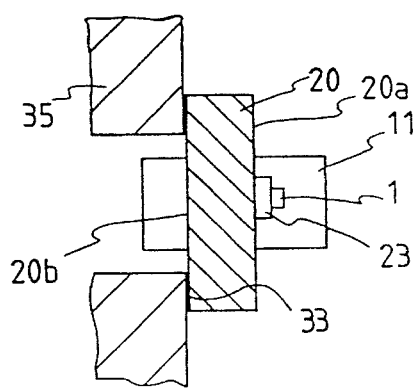

In FIG. 19C, the same laser device of FIG. 19B is fixed to the fixing board 35 by adhesive and fixing jigs 33*a*.

In Pig. 19D, the portion of the lead frame not covered with the sealing resin layer 11 is bonded to the fixing board 35 by adhesive 33.

Figure 19E:
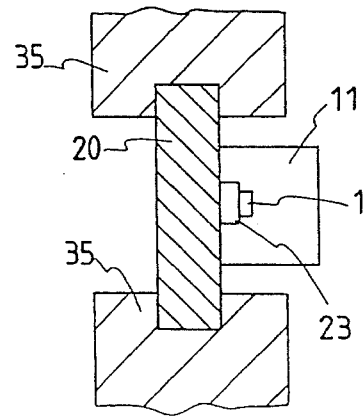

In FIG. 19E, the same laser device as in FIG. 19B or 19C is captured in a recess of the fixing board 35.

In these fixing apparatus, the lead frame 20 and the fixing board 35 are made of material of good thermal conductivity. Thus heat generated by laser operation can be readily transferred to the fixing board 35 at low thermal resistance, thereby providing good heat dissipation. Accordingly, temperature rise of the sealing resin layer 11 is reduced, and thus displacement of the light emitting point is further reduced.

A semiconductor laser device according to a third embodiment of the present invention will be described with reference to FIGS. 20A, 20B, 21A and 21B. The semiconductor laser device of this third embodiment is also of the mold-type.

Figure 20A:
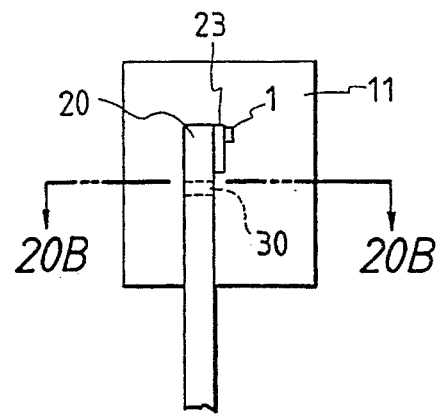
FIG. 20A is a side view showing a semiconductor laser device according to a third embodiment of the present invention.
Figure 20B:
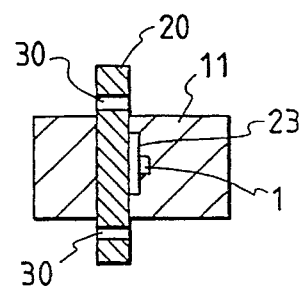
FIG. 20B is a cross sectional view taken along line 20B—20B of FIG. 20A.

As shown in FIGS. 20A and 20B, a laser diode element 1 having end-face destruction preventing layers is secured to a lead frame 20 by way of an interposed photo diode 23. Again, the lead frame 20 mechanically supports and electrically controls the laser diode element 1 and the photo diode. 23. The assembly of those elements is covered with a sealing resin layer 11.

In this third embodiment, two fixing through-holes 30 are formed in the lead frame. As best illustrated in FIG. 20B, those through-holes 30 are located on opposite sides of the sealing resin layer 11 covering the assembly.

Figure 21A:
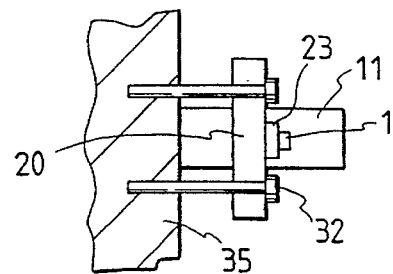
FIG. 21A is a side view, partly in cross section, showing a structure for fixing the laser device of FIGS. 20A and 20B to a fixing board.
Figure 21B:
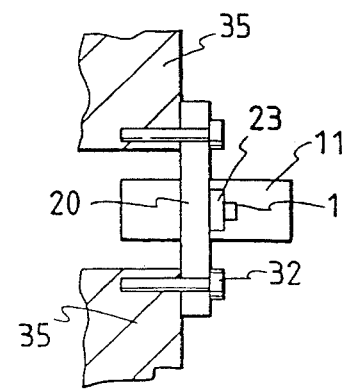
FIG. 21B is a side view, partly in cross section, showing another structure for fixing the laser device of FIGS. 20A and 20B to a fixing board.

Two examples of mounting semiconductor laser board devices to a fixing board are illustrated in FIGS. 21A and 21B. In those examples, bolts 32 are used to affix the lead frame 20 to the fixing board 35. Material of relatively low thermal expansion coefficient and good thermal conductivity, such as solder and resin, may be used in place of bolts.

The displacement of the light emitting point in the semiconductor laser device of this embodiment was measured under substantially the same conditions as those in the first embodiment. The displacement quantities measured were comparable those plotted in FIG. 2.

The semiconductor laser device illustrated in the third embodiment includes a rectangular sealing resin layer 11. However, the sealing resin layer 11 may take other shapes, such as an asymmetrical shape, if the lead frame 20 has through-holes 30 for fixing the laser device to the fixing board 35.

A mold-type semiconductor laser device according to a fourth embodiment of the present invention will be described with reference to FIGS. 5A and 5B.

Figure 5A:
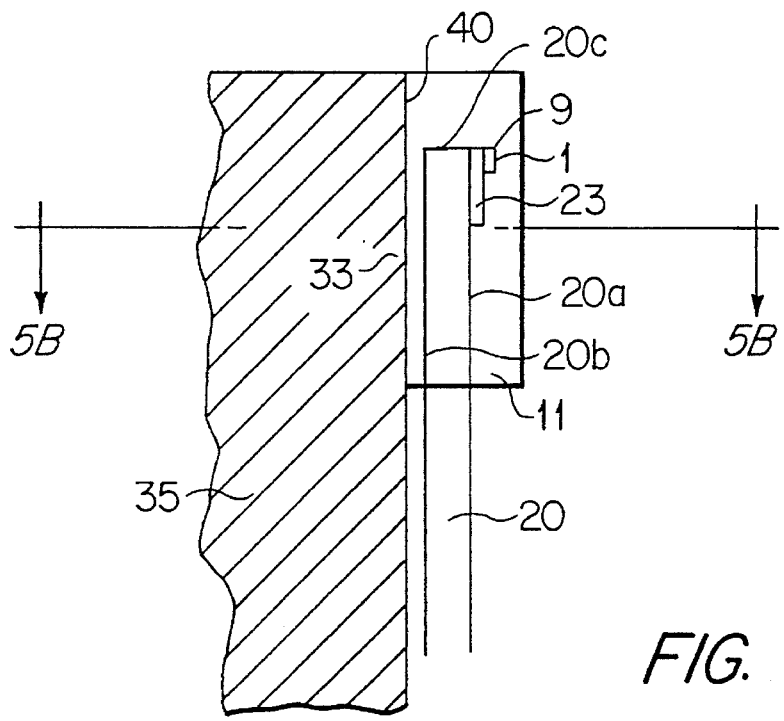
FIG. 5A is a side view showing a semiconductor laser device according to a third embodiment of the present invention.

As shown in FIG. 5A, a laser diode element 1 having end-face destruction preventing layers is secured to a lead frame 20, again by way of interposed photo diode 23. The lead frame 20 mechanically supports and electrically controls the laser diode element 1 and the photo diode 23. An end face 20c of the lead frame lies in a plane containing a light emitting end face 9 the laser diode element 1. The assembly of those elements is covered with a sealing resin layer 11.

In the fourth embodiment, the surface 40 of the sealing resin layer 11 lying above the surface 20b of the lead frame 20, which is opposed to the surface 20a to which the laser diode element 1 and the photo diode 23 are mounted, is placed against the fixing board 35 when the semiconductor laser device is fixed to the fixing board. Distance $\Delta X1$ between the surfaces 40 and 20b is kept constant over those surfaces.

As seen from FIGS. 16A–16E, showing the results of the simulation in a pick-up optical system, when the displacement of the light emitting point is $\Delta X$, the beam spot shift on the photo diode is highly magnified.

To cope with this, the distance $\Delta X1$ is selected so as to satisfy the following equation:

$$\Delta X1 \leq (\Delta L/M)/(\alpha \times \Delta T) \tag{1}$$

where $\alpha$ indicates linear expansion coefficient of the sealing resin layer, and $\Delta T$ indicates the change in ambient temperature. $\Delta L$ represents a tolerable shift of the beam spot on the divided photo diodes of the pick-up device of the type in which a semiconductor laser device is used as a reproduction light source in an optical disc system. M is an image forming magnification factor defined by the magnification of a lens system, including at least one lens, which is located along the distance of an optical path between the light emitting point of a laser diode element and the divided photo diode of a pick-up device.

Specifically, when transport epoxy resin is used for the sealing resin layer, which is essential to the present invention, its linear expansion coefficient $\alpha$ is 5 to $7 \times 10^{-5}/°C$. Under conditions where ambient temperature change $\Delta T$ is within $-10°$ to $60°$ C., the tolerance $\Delta 1$ of the beam spot shift is 10 μm, the magnification M is 8, and the linear expansion coefficient $\alpha$ is $6 \times 10^{-5}/°C$., the formula (1) indicates that the distance $\Delta X1$ must be $$\Delta X1 \leq 0.2 \text{ μm}.$$

The magnification M and the beam spot shaft tolerance $\Delta L$ depend on the optical system used. The ambient temperature change $\Delta T$ also depends on the application. When an optical disc system is installed in a vehicle, the temperature change $\Delta T$ ranges from $-15°$ to $70°$ C. As a matter of course, the distance $\Delta X1$ is again defined by the formula (1).

Figure 5B:
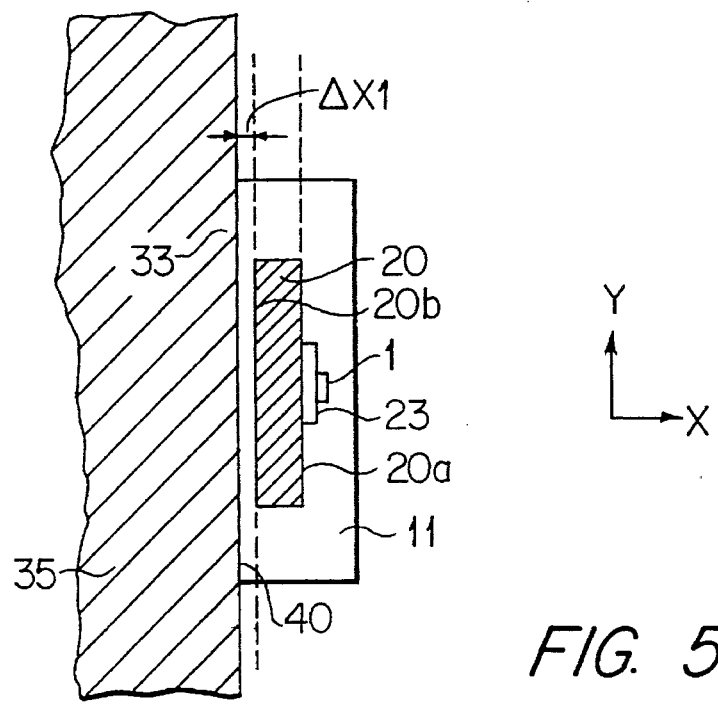
FIG. 5B is a cross section view taken along line 5B—5B of FIG. 5A.
Figure 8:
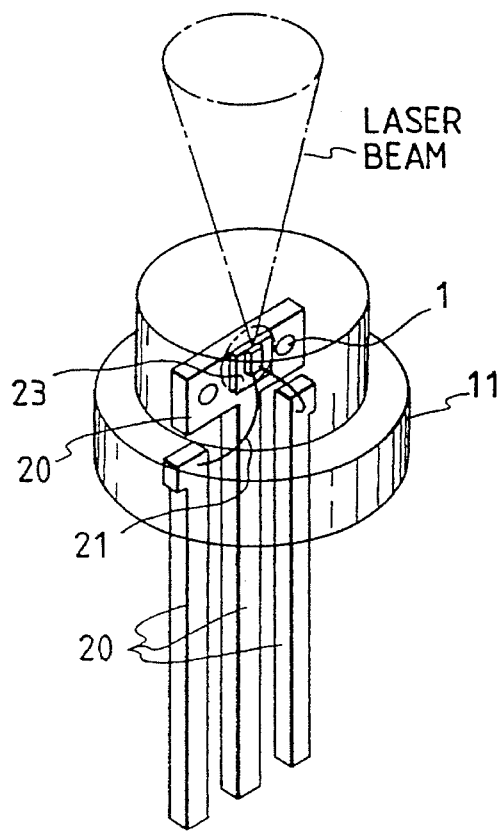
FIG. 8 is a perspective view of a semiconductor laser device of the mold-type.

When the semiconductor laser device is fixed to the fixing board 35 in a manner that the mounting surface 40 of the sealing resin layer is placed against the fixing board 35, the displacement of the lead frame 20 relative to the fixing board 35 depends on only the influence of the sealing resin layer 11 on the lead frame, which is separated from the mounting surface 40 by the distance $\Delta X1$, as seen in FIG. 5B.

All of the semiconductor laser devices thus far described satisfy the tolerable value of the beam spot shift on the photo diode that is acceptable in pick-up devices for compact discs. Thus, the present invention succeeds in realizing a semiconductor laser device which is inexpensive and can be of various shapes, by using the semiconductor laser devices of the mold-type. Further, in terms of light emitting point stability, the semiconductor laser device of the invention is comparable with semiconductor laser devices of the can-type.

As seen from the foregoing description, displacement of the lead frame, which is caused by thermal expansion of the sealing resin layer, can be minimized by using a sealing resin layer that is shaped symmetrically with respect to the lead frame, or by fixedly mounting the lead frame to an external fixing board, with the portion of the sealing resin layer providing the surface affixed to the fixing board having a limited thickness. Accordingly, the displacement of the laser diode element, which is fixed to the lead frame, is minimized during operation of the laser device. Consequently, displacement of the light emitting point can be considerably reduced. The mold-type semiconductor laser device of the invention, which is low in cost and conducive to various shapes, is also excellent in light emitting point stability. Thus, the present invention enables the semiconductor laser device of the mold-type to be applied, without any additional position-correcting mechanism, in optical devices requiring high stability of the light emitting point, such as pick-up devices for compact discs. Recently semiconductor devices of the mold-type have found a variety of applications because of the beneficial features of low cost and flexible shaping. The present invention further increases the applications for mold-type semiconductor laser devices.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor laser device comprising a laser diode element having at least one end face for emitting a laser beam, a lead frame for electrically controlling the laser diode element and having a planar major surface for mechanically supporting the laser diode element with a support member interposed therebetween, a sealing resin layer allowing the laser beam to pass therethrough and covering at least the laser diode element on the lead frame in a sealing manner, and an external fixing board, wherein a mounting surface of the sealing resin layer, placed against the external fixing board, is uniformly separated from an adjacent surface of the lead frame by a distance $\Delta X1$ (mm) defined by the following formula:

$$\Delta X1 \leq (\Delta L/M)/(\alpha \times \Delta T)$$

where $\alpha$ is a linear expansion coefficient of the sealing resin layer, $\Delta T$ is a change in ambient temperature, $\Delta L$ is a tolerable shift of a laser beam spot on a divided photo diode of a pick-up device included with the semiconductor laser device in an optical disc system, and M is an image forming magnification defined by a magnification of a lens system including at least one lens positioned along a distance in an optical path between a light emitting point of the laser diode element and the divided photo diode of the pick-up device.

* * * * *